United States Patent
Nosowicz

(10) Patent No.: US 7,259,602 B2
(45) Date of Patent: Aug. 21, 2007

(54) METHOD AND APPARATUS FOR IMPLEMENTING FAULT TOLERANT PHASE LOCKED LOOP (PLL)

(75) Inventor: Eugene James Nosowicz, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 11/186,595

(22) Filed: Jul. 21, 2005

(65) Prior Publication Data

US 2007/0018698 A1    Jan. 25, 2007

(51) Int. Cl.
*H03L 7/06* (2006.01)

(52) U.S. Cl. ........................ 327/159; 375/376

(58) Field of Classification Search ........ 327/147–150, 327/156–159; 331/17, 25; 375/373–376
See application file for complete search history.

(56) References Cited

U.S. PATENT DOCUMENTS

| | | | | |
|---|---|---|---|---|
| 6,031,425 A | * | 2/2000 | Hasegawa | ................. 331/1 A |
| 6,247,160 B1 | * | 6/2001 | Davidsson et al. | ......... 714/797 |
| 6,253,348 B1 | * | 6/2001 | Davidsson et al. | ......... 714/797 |
| 6,637,005 B1 | * | 10/2003 | Kohnen | ..................... 714/797 |
| 6,720,793 B1 | * | 4/2004 | Trimberger | ..................... 326/9 |
| 6,727,736 B1 | * | 4/2004 | Tsang et al. | ................. 327/157 |
| 6,748,041 B1 | * | 6/2004 | Gutierrez et al. | ........... 375/376 |
| 6,864,729 B2 | * | 3/2005 | Aoki et al. | ................. 327/157 |
| 7,054,374 B1 | * | 5/2006 | Jensen et al. | ................ 375/257 |
| 2003/0056170 A1 | * | 3/2003 | Majumdar | ................. 714/820 |

* cited by examiner

*Primary Examiner*—Kenneth B. Wells
*Assistant Examiner*—Thomas J. Hiltunen
(74) *Attorney, Agent, or Firm*—Joan Pennington

(57) ABSTRACT

A method and apparatus are provided for implementing a fault tolerant phase locked loop (PLL). The PLL circuit includes a divide by N circuit defined by a plurality of sub-divide by N functions, each providing a feedback frequency signal applied to a voter circuit. The voter circuit provides an output feedback frequency signal based upon a majority vote of the sub-divide by N functions.

11 Claims, 3 Drawing Sheets

METHOD AND APPARATUS FOR IMPLEMENTING FAULT TOLERANT PHASE LOCKED LOOP (PLL)

FIELD OF THE INVENTION

The present invention relates generally to the data processing field, and more particularly, relates to a method and apparatus for implementing a fault tolerant phase locked loop (PLL).

DESCRIPTION OF THE RELATED ART

Phase locked loop (PLL) circuits are widely used in many different applications and are the heart of most digital systems. Typically, PLL circuits provide a system clock or timing signal which dictates the cycle time at which a digital system operates. When implementing a PLL on a CMOS microprocessor or other logic chip for on-chip clock generation, a wide range of process variation can occur. If the PLL operates at too slow a speed, the processing throughput of the system is degraded. If the PLL operates at too high a speed, the system may not function since critical operations may not complete between clock signals.

Most modern day PLLs can be programmed to operate at different speeds, they contain volatile memory which is usually in the form of latches. A hard failure of one or more latches can force the PLL to fail or operate at an incorrect speed. Likewise, latches are subject to soft errors, usually referred to as single event upsets (SEUs).

For example, a SEU happens when subatomic particles strike the portion of the silicon on which the latch resides. This can cause the content of the latch to change states, forcing the PLL to the wrong frequency. Since a major source of the subatomic particles are cosmic in origin, the SEU can be a minor problem in terrestrial and low altitude avionic systems but a moderate cause of failure in high altitude and space applications.

A need exists for an improved phase locked loop (PLL) circuit. It is desirable to provide such a PLL circuit that is fault tolerant.

SUMMARY OF THE INVENTION

Principal aspects of the present invention are to provide a method and apparatus for implementing a fault tolerant phase locked loop (PLL). Other important aspects of the present invention are to provide such method and apparatus for implementing a fault tolerant phase locked loop (PLL) substantially without negative effect and that overcome many of the disadvantages of prior art arrangements.

In brief, a method and apparatus are provided for implementing a fault tolerant phase locked loop (PLL). The PLL circuit includes a divide by N circuit defined by a plurality of sub-divide by N functions, each providing a feedback frequency signal applied to a voter circuit. The voter circuit provides an output feedback frequency signal based upon a majority vote of the sub-divide by N functions.

In accordance with features of the invention, the divide by N circuit includes compare and reload logic coupled to each of the plurality of sub-divide by N functions. Each of the plurality of sub-divide by N functions includes a counter circuitry and an N register storing a factor for dividing a received frequency signal. The stored factors of each of the plurality of sub-divide by N functions are compared by the compare and reload logic. When a different value is identified in one of the plurality of sub-divide by N functions, the stored factor from the other sub-divide by N functions is loaded into the one sub-divide by N function. A predefined counter event from the counter circuitry of the plurality of sub-divide by N functions are compared by the compare and reload logic. When a failed counter event is identified, the counter circuitry of the plurality of sub-divide by N functions are synchronized.

In accordance with features of invention, the effects of isolated hard failures and SEUs, which can cause errors, are significantly lowered. The present invention is especially applicable to radiation hardening techniques without requiring semiconductor device innovations.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
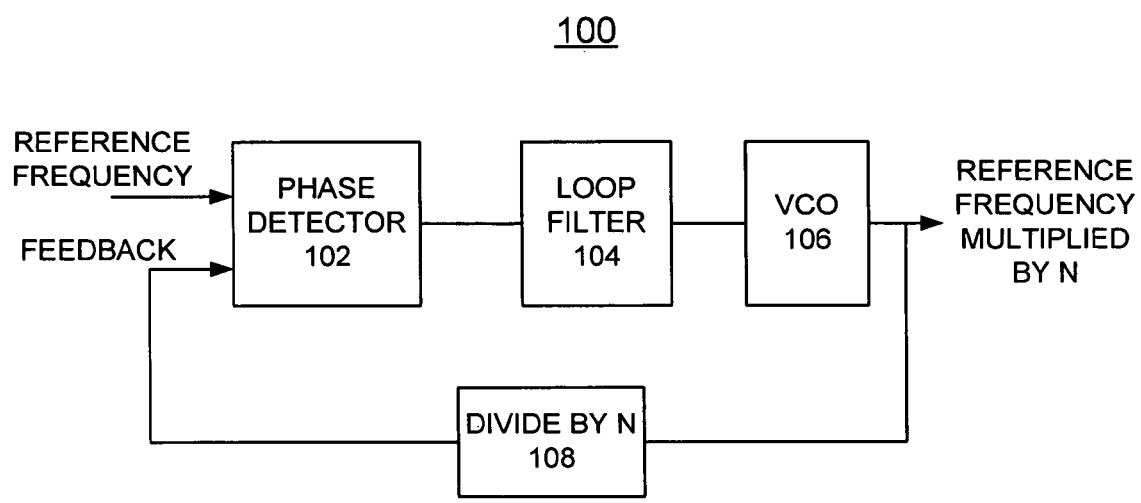
FIG. 1 is a block diagram illustrating a phase locked loop (PLL) circuit in accordance with the preferred embodiment.

Having reference now to the drawings, in FIG. 1, there is shown a Phase Locked Loop (PLL) circuit generally designated by the reference character 100 in accordance with the preferred embodiment. PLL circuit 100 is a closed loop system, having feedback. In FIG. 1, PLL circuit 100 is shown in simplified form sufficient for understanding the present invention.

PLL circuit 100 includes a phase detector 102 that compares an input reference frequency signal REFERENCE FREQUENCY to an output feedback frequency signal FEEDBACK. Phase detector 102 generates an error signal at its output responsive to applied FEEDBACK and REFERENCE FREQUENCY signals. The generated error signal is applied to a loop filter 104, implemented by a low pass filter. When the inputs to the phase detector 102 are both of the same frequency, the output of the loop filter 104 is a stable DC value. The output of the loop filter 104 is applied to a Voltage Controlled Oscillator (VCO) 106, which varies its frequency proportionally to the applied input voltage. The output of the VCO 106 is then applied to a Divide by N circuit 108 that generates the FEEDBACK signal applied to the phase detector 102. The Divide by N circuit 108 is programmed to divide the frequency of its input signal VCO output by a programmable value N. When properly designed, the closed loop systems uses feedback to guarantee that the two inputs to the phase detector 102 are identical in frequency. Since the output of the divide by N 108 matches the frequency of the Reference In, the output of the VCO 106 is multiplied by N and is adjusted by the programming that determines N.

In conventional arrangements, the Divide by N consists of a register used to store the divide factor, N and a suite of digital storage elements which provide a frequency divide function. This divide function is well known to one skilled in the art and can be implemented by an up/down counter or another appropriate mechanism. Since the Divide by N circuit consists of storage elements, it is subject to Single Event Upsets (SEUs) caused by cosmic particles or particles emitted by radioactive decay of the materials in the environment near the circuit. Once the value in the storage elements is upset, the output of the PLL either shifts timing values for one or more cycles, or makes a permanent shift to an undesired output frequency.

In accordance with features of the preferred embodiment, a Divide by N function 108 is provided that minimizes the risk of a SEU from affecting the function of the PLL by masking and correcting the error. Secondly, Divide by N function 108 of the preferred embodiment will mask at least one single permanent failure in the hardware defining the Divide by N function. The new divide by N 108 of the preferred embodiment contains redundancy and soft error correction. Since the VCO 106 and the loop filter 104 do not contain storage elements, the VCO and the loop filter are not generally exposed to SEUs. The phase detector 102 may contain storage elements, but these storage elements are updated every clock cycle and single cycle errors can be filtered out with the low pass filter 104.

Figure 2:
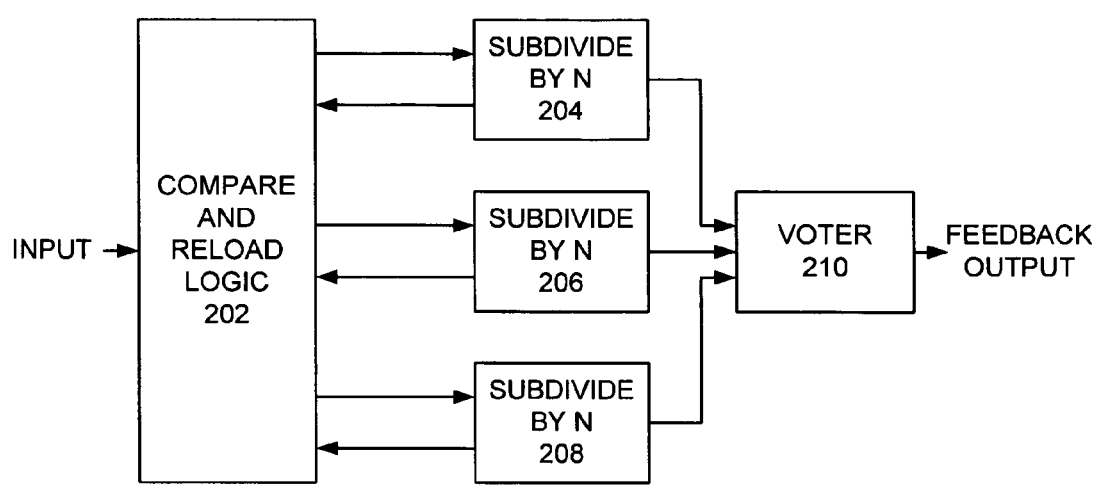
FIG. 2 is a schematic diagram illustrating an exemplary PLL divide by N of the PLL circuit of FIG. 1 in accordance with the preferred embodiment.

Referring now to FIG. 2, there is shown an exemplary Divide by N function 108 in accordance with the preferred embodiment. Divide by N function 108 includes a compare and reload logic 202 coupled to a plurality of sub-divide by N functions 204, 206, 208, each providing an input to a voter circuit 210. During normal operation, the inputs and outputs of each of sub-divide by N functions 204, 206, 208, are identical as are the contents of all their corresponding storage elements.

What differentiates the operation of the Divide by N function 108 is the capability for error masking and soft error correction. Error masking is accomplished by the voter circuit 210. The voter circuit 210 is a simple majority vote function. That is if the three inputs are not the same, the voter circuit 210 selects the two inputs that are of equal value as its output.

In the case of a hard failure or a SEU, while the hard fail is not repaired, the output of the failing sub-divide by N function 204, 206, or 208 that is input to the voter circuit 210 is ignored. It should be understood that multiple hard fails or SEUs can be masked as long as they all occur in the same sub-divider circuit 204, 206 or 208.

In the case of a SEU in one of the sub-divide by N function 204, 206, or 208, error masking continues by operation of the voter circuit 210 so there is no change to the PLL output. However, an error caused by a SEU advantageously is corrected with the compare and reload logic 202.

Figure 3:
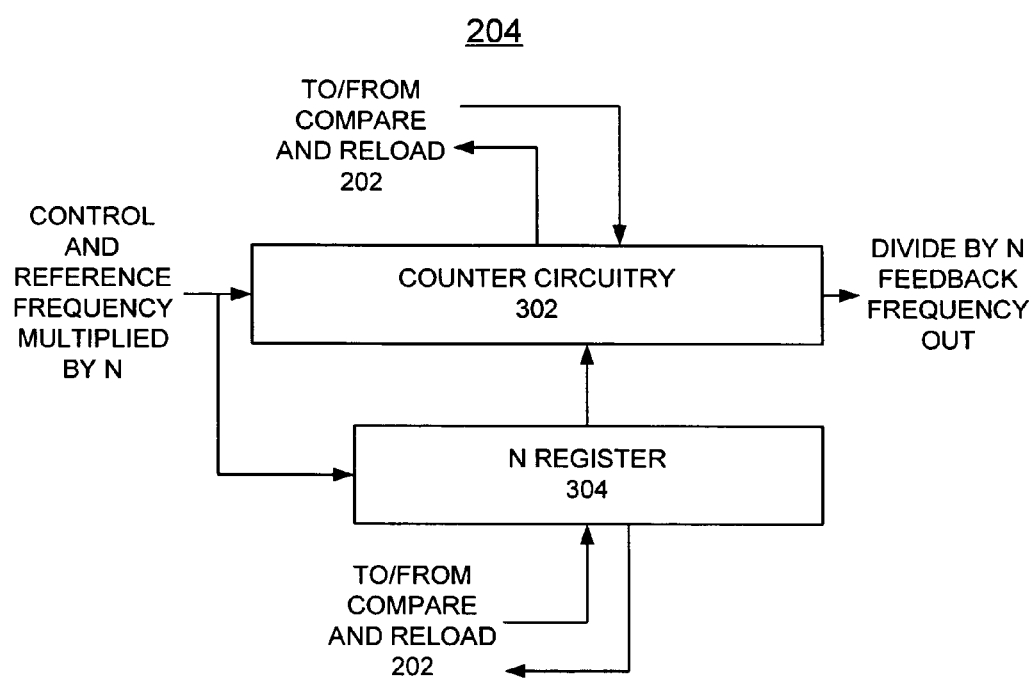
FIG. 3 is a schematic diagram illustrating an exemplary simplified subdivide by N of the PLL divide by N of FIG. 2 in accordance with the preferred embodiment.

Referring also to FIG. 3, there is shown an exemplary simplified sub-divide by N function 204 in accordance with the preferred embodiment. Sub-divide by N function 204 includes a counter circuitry 302 and a storage element 304, such as an N register 304 which contains the factor by which the input reference frequency multiplied by N of the incoming clock is divided. The compare and reload logic 202 requires that the contents of this register 304 in each of the three sub-divide by N function 204, 206, 208 be continually compared.

During normal operation, the register contents of N register 304 from all three sub-divide by N functions 204, 206, 208 agree and no action is taken. Assume a SEU occurs in one of the sub-function registers 304. It is highly unlikely that there will be simultaneous SEUs in more than one of the sub-divide by N function 204, 206, 208 unless there is a gross system failure or, for space borne equipment, if it is struck by particles from a massive solar emission due to flares. When the sub-function register contents of one N register 304 disagrees with the other two of N registers 304, the compare and reload logic 202 identifies the difference and transfers the correct value into the N register 304 that was disturbed. If the failure is a permanent defect, the error cannot be repaired; it is only masked by the voter circuit 210. The compare and reload function 202 is controlled solely by combinatorial logic and happens every input clock cycle.

Since the counter circuitry 302 also contains storage elements, it is also subject to SEU. The divide by N counter circuitry 302 includes a counter fed by modified contents of the N register 304. A typical example of the function will be described. This is one simple example and not all encompassing. In order to divide a frequency by N, the counter circuitry 302 is used to generate an event every N/2 counts to signify a change of state on the output is required. In order to count N/2 cycles of the input clock, a standard up counter can be loaded to the 1s compliment of N/2 and when each and all of the bits in the counter reach a logical 1, then N/2 counts of the input clock have passed through the counter.

Since this sub-divide by N function 204 generates an event, for example, contents all 1s, these events can be compared between all three sub-divide by N function 204, 206, 208 rather than comparing the individual bits in the counters 302. If one of the counters 302 does not generate a timing even at the same time as the other counters 302, the failing counter 302 is resynchronized by loading the appropriate N/2 number into the failing counter at the same time that the counters 302 in the other two of the sub-divide by N functions 204, 206, 208 are reloaded and accomplish resynchronization. If a hard failure occurs in one of the sub-divide by N functions 204, 206, 208 occurs, it is still masked by the voter circuit 210 of FIG. 2.

In brief summary, it should be noted that Divide by N function 108 in accordance with the preferred embodiment will mask a failure in one of the sub-divide by N functions 204, 206, 208 and more importantly correct SEUs as long as they only occur in one of the sub-divide by N functions 204, 206, 208 therefore yielding superior reliability especially in avionic or space applications.

While the present invention has been described with reference to the details of the embodiments of the invention shown in the drawing, these details are not intended to limit the scope of the invention as claimed in the appended claims.

What is claimed is:

1. Apparatus for implementing a fault tolerant phase locked loop (PLL) circuit comprising:
   a divide by N circuit providing an output feedback frequency signal; said divide by N circuit including a plurality of sub-divide by N functions;
   said divide by N circuit including compare and reload logic coupled to each said sub-divide by N function;
   each of said plurality of sub-divide by N functions including a counter circuitry and an N register storing a factor for dividing a received frequency signal;
   said compare and reload logic responsive to identifying a failed counter event, synchronizing said counter circuitry of said plurality of sub-divide by N functions;
   a voter circuit coupled to said plurality of sub-divide by N functions; each of said sub-divide by N function providing a feedback frequency signal applied to a voter circuit; and
   said voter circuit providing said output feedback frequency signal based upon a majority vote of the sub-divide by N functions.

2. Apparatus for implementing a fault tolerant PLL circuit as recited in claim 1 wherein said stored factors of each of the plurality of sub-divide by N functions are compared by said compare and reload logic.

3. Apparatus for implementing a fault tolerant PLL circuit as recited in claim 2 wherein said compare and reload logic identifies a different value stored in one of the plurality of sub-divide by N functions; and responsive to identifying said different value, said compare and reload logic loads said stored factor from the other sub-divide by N functions into the one sub-divide by N function.

4. Apparatus for implementing a fault tolerant PLL circuit as recited in claim 1 wherein said compare and reload logic compares a predefined counter event from each said counter circuitry of said plurality of sub-divide by N functions.

5. Apparatus for implementing a fault tolerant PLL circuit as recited in claim 1 includes a phase detector receiving an input reference frequency signal; and said divide by N circuit provides said output feedback frequency signal to said phase detector.

6. Apparatus for implementing a fault tolerant PLL circuit as recited in claim 5 includes a loop filter coupled to said phase detector.

7. Apparatus for implementing a fault tolerant PLL circuit as recited in claim 5 includes a Voltage Controlled Oscillator (VCO) coupled to said phase detector; said VCO providing a multiplied reference frequency to said divide by N circuit.

8. Apparatus for implementing a fault tolerant PLL circuit as recited in claim 1 wherein said plurality of sub-divide by N functions includes three sub-divide by N functions, and wherein said voter circuit provides said output feedback frequency signal based upon at least two matching feedback frequency signals from said three sub-divide by N functions.

9. A method for implementing a fault tolerant phase locked loop (PLL) circuit comprising:
   providing a plurality of sub-divide by N functions, providing compare and reload logic coupled to each said sub-divide by N function, and each of said plurality of sub-divide by N functions including a counter circuitry and an N register storing a factor for dividing a received frequency signal, and a voter circuit coupled to each of said sub-divide by N functions to define a divide by N circuit,
   generating a feedback frequency signal with each said sub-divide by N function;
   comparing a predefined counter event from each said counter circuitry of said plurality of sub-divide by N functions using said compare and reload logic,
   responsive to identifying a failed counter event, synchronizing said counter circuitry of the plurality of sub-divide by N functions using said compare and reload logic;
   applying said feedback frequency signals from each of said sub-divide by N functions to said voter circuit; and
   providing an output feedback frequency signal based upon a majority vote of said feedback frequency signals with said voter circuit.

10. A method for implementing a fault tolerant PLL circuit as recited in claim 9 further includes comparing said stored factors of each of the plurality of sub-divide by N functions using said compare and reload logic.

11. A method for implementing a fault tolerant PLL circuit as recited in claim 10 further includes responsive to identifying a different value stored in one of the plurality of sub-divide by N functions, said compare and reload logic loads said stored factor from the other sub-divide by N functions into the one sub-divide by N function.

* * * * *